(12) United States Patent
Sugaya et al.

(10) Patent No.: US 10,624,206 B2
(45) Date of Patent: Apr. 14, 2020

(54) CIRCUIT BOARD AND CIRCUIT DEVICE

(71) Applicant: IRISO ELECTRONICS CO., LTD., Kanagawa (JP)

(72) Inventors: Yujiro Sugaya, Kanagawa (JP); Yuki Asanuma, Kanagawa (JP)

(73) Assignee: IRISO ELECTRONICS CO., LTD., Kanagawa (JP)

( * ) Notice: Subject to any disclaimer, the term of this patent is extended or adjusted under 35 U.S.C. 154(b) by 91 days.

(21) Appl. No.: 15/723,375

(22) Filed: Oct. 3, 2017

(65) Prior Publication Data
US 2018/0110121 A1 Apr. 19, 2018

(30) Foreign Application Priority Data
Oct. 14, 2016 (JP) .................................. 2016-202891

(51) Int. Cl.
| | |
|---|---|
| *H05K 1/09* | (2006.01) |
| *H05K 1/11* | (2006.01) |
| *H05K 3/36* | (2006.01) |
| *H05K 3/40* | (2006.01) |
| *H05K 1/14* | (2006.01) |

(52) U.S. Cl.
CPC .............. *H05K 1/09* (2013.01); *H05K 1/112* (2013.01); *H05K 1/144* (2013.01); *H05K 3/366* (2013.01); *H05K 3/4038* (2013.01); *H05K 2201/0338* (2013.01); *H05K 2201/041* (2013.01); *H05K 2201/098* (2013.01);
(Continued)

(58) Field of Classification Search
CPC ........ H05K 1/09; H05K 1/112; H05K 3/4038; H05K 3/366; H01L 23/49827; H01L 23/49866; H01L 23/49822
See application file for complete search history.

(56) References Cited

U.S. PATENT DOCUMENTS 6,051,093 A 4/2000 Tsukahara
7,939,945 B2 * 5/2011 Sauciuc ................. H05K 3/321
257/774
(Continued)

FOREIGN PATENT DOCUMENTS

DE 102006049562 A1 4/2008
GB 2074604 A 11/1981
(Continued)

OTHER PUBLICATIONS

Extended European Search Report for European Patent App. No. 17194324.4 (dated Feb. 13, 2018).
(Continued)

*Primary Examiner* — Nathan Milakovich
(74) *Attorney, Agent, or Firm* — Cermak Nakajima & McGowan LLP; Tomoko Nakajima

(57) ABSTRACT

To provide a circuit board that is capable of establishing electrical connection, that is thinner, and that has a higher maintainability. A circuit board includes a substrate including a hole portion that penetrates the substrate in a plate thickness direction, and a connector region including a first conductor layer that closes one side of the hole portion, liquid metal disposed in a recess formed by the hole portion and the first conductor layer, and a sealing layer that is the liquid metal cured on a liquid surface side. The liquid metal may be in contact with a second conductor layer formed in the recess.

14 Claims, 8 Drawing Sheets

(52) U.S. Cl.
CPC .............. *H05K 2201/09727* (2013.01); *H05K 2201/09827* (2013.01); *H05K 2201/10265* (2013.01)

(56) References Cited

U.S. PATENT DOCUMENTS

| | | | | |
|---|---|---|---|---|
| 8,587,493 B2* | 11/2013 | Dickey | ................ | H01Q 1/364 343/789 |
| 9,326,387 B2* | 4/2016 | Ju | ......................... | H05K 3/32 |
| 2002/0013010 A1* | 1/2002 | Maruyama | ......... | G01R 1/06711 438/18 |
| 2007/0090528 A1 | 4/2007 | Ikeda | | |
| 2007/0200572 A1* | 8/2007 | Breton | ............... | G01R 1/07378 324/754.03 |
| 2007/0238282 A1* | 10/2007 | Furman | ............... | H01L 21/4882 438/612 |
| 2008/0217784 A1* | 9/2008 | Binder | .................. | H01L 21/486 257/762 |
| 2009/0001576 A1* | 1/2009 | Tuli | .................. | H01L 23/49827 257/750 |

FOREIGN PATENT DOCUMENTS

| | | |
|---|---|---|
| JP | 10-125829 A | 5/1998 |
| JP | 2007-158024 A | 6/2007 |
| JP | 2012-212556 A | 11/2012 |
| JP | 2017041375 A * | 2/2017 |
| WO | WO01/61063 A1 | 8/2001 |

OTHER PUBLICATIONS

Product Data Sheet, Liquid Metal, Gallium and Gallium Alloys, Form No. 97826 R7, 2019, Indium Corporation, 2 pp.

* cited by examiner

CIRCUIT BOARD AND CIRCUIT DEVICE

BACKGROUND OF THE INVENTION

1. Field of the Invention

The present disclosure relates to a circuit board and a circuit device.

2. Description of the Related Art

Various mounting techniques, such as soldering, ultrasonic welding, and the like to mount an electronic component on a circuit board are known. Furthermore, in association with the demand to reduce the size of the electronic devices, size reduction of electronic components and circuit boards constituting the electronic device is becoming more in demand. On the other hand, for example, regarding electronic devices that have been determined to be defective in inspections and the like, not all the inspected electronic devices are disposed. There is a demand for maintainability that allows some of the defective electronic devices to have the defective components therein to be replaced, for example.

Japanese Unexamined Patent Application Publication No. 2007-158024 discloses a BGA semiconductor device that is an example of a mounting technique using soldering. The BGA semiconductor device includes a printed circuit board in which a single or a plurality of electrodes are disposed on a surface, a ball grid array (BGA) electronic component that is disposed so as oppose the printed circuit board and in which solder balls are disposed on the opposing surface at positions corresponding to the electrodes, and connecting components that are provided between the arrays of electrodes on the printed circuit board and the BGA electronic component and in which a plurality of conductor layers are formed so as to be separated at an interval of the disposition of the electrodes at portions around a prismatic elastic body that extends in the electrode array direction. Furthermore, in the BGA semiconductor device each of the electrodes of the printed circuit board and the solder balls of the BGA electronic component are connected to each other with the conductor layers of the connecting components.

Japanese Unexamined Patent Application Publication No. 10-125829 discloses a semiconductor device that is an example of a mounting technique considering maintainability. In the semiconductor device including a through-hole mount package in which a plurality of electrically connected outer leads inserted into through holes are provided in a protruding manner in a sealing body, in at least a paired position opposing each other in the sealing body, pulling-out tools that pull out the group of outer leads by biasing the through-hole mount package while receiving reactive force from the structure body on the through hole side are mounted.

Japanese Unexamined Patent Application Publication No. 2012-212556, paragraph 0085, FIG. 9 is also another example of a mounting technique considering maintainability. In other words, pin holding sleeves (211) of an electronic component mount module includes a pair of contact means (212), and each of the contact means (212) is formed as a metal spring in which the upper side portion thereof has a hooked shape to pinch the distal end portion of a pin (148, 163). Accordingly, the pin (148, 163) is detachably held by the contact means (212).

SUMMARY OF THE INVENTION

While the connector structure between the semiconductor element and the circuit board using BGA exemplified in Japanese Unexamined Patent Application Publication No. 2007-158024 contributes to size reduction, basically, dismounting is not considered and, therefore, maintainability is low. Furthermore, in the sockets (for example, a pin grid array (PGA)) including screws, metal springs, and the like as exemplified in Japanese Unexamined Patent Application Publication No. 10-125829 and Japanese Unexamined Patent Application Publication No. 2012-212556, paragraph 0085, FIG. 9, while maintainability is high since mounting and dismounting between the semiconductor element and the circuit board are facilitated, spring structures and screw holes are required and the size of the connector structure increases.

The present disclosure has been made in the content of the above conventional technique. An object thereof is to provide a circuit board that is capable of establishing electrical connection, that is smaller, and that has a higher maintainability.

In order to achieve the above object, the present disclosure is configured in the following manner.

In other words, the present disclosure provides a circuit board including a substrate including a hole portion that penetrate in a thickness direction, a first conductor layer that closes one side of the hole portion, liquid metal disposed in a recess formed by the hole portion and the first conductor layer, and a sealing layer that coats a surface of the liquid metal.

According to the above, since the connector region where the liquid metal is filled in the hole portion formed in the substrate serves as an area for connecting an object to be connected, a smaller connector structure can be obtained. Furthermore, since the conductive connection with the object to be connected is achieved by having the object to be connected penetrate the sealing layer and come in contact with the liquid metal, and since the conductive connection can be cancelled by drawing out the object to be connected, an electrical connection with high maintainability can be performed.

The sealing layer may be a film of the liquid metal oxidized on a liquid surface side. According to the above, the oxide film formed on the liquid surface side of the liquid metal can be used as a sealing layer without preparing a member for sealing that prevents vaporization and leaking of the liquid metal. Furthermore, the oxide film may be a skin-like film of the liquid metal formed on a liquid surface side. According to the above, the oxide film can be broken with a small insertion force (for example, insertion force that only amounts to insertion force countering the buoyancy that the oxide film receives from the liquid metal), and after the film is broken as well, the object to be connected can be made to be in conductive contact by inserting the object to be connected into the liquid metal with a small insertion force.

The recess may have a second conductor layer to which the liquid metal comes in contact. According to the above, for example, in a case in which the first conductor layer becomes diffused by directly contacting the liquid metal, the diffusing can be suppressed by depositing the second conductor layer.

The second conductor layer may be a nickel (Ni) layer. By selecting Ni that is not easily diffused as the material of the second conductor layer, changes in the qualities of the first conductor layer, the second conductor layer, and the liquid metal can be suppressed. Furthermore, the thickness of the second conductor layer may be within the range of 0.3 μm to 5 μm. With the above, diffusing of the first conductor layer can be suppressed while maintaining high conductivity.

A third conductor layer may be provided between the second conductor layer and the liquid metal in the hole portion. In such a case, for example, formation of oxide film on the front surface of the second conductor layer can be efficiently prevented and the pinholes formed in the second conductor layer can be filled while the liquid metal is filled after the second conductor layer has been deposited. Furthermore, a gold (Au) layer may be used in the third conductor layer. With the above, formation of oxide film can be suppressed. Furthermore, the thickness of the third conductor layer may be within the range of 0.001 μm to 0.5 μm. With the above, the second conductor layer can be efficiently functioned, and a more inexpensive third conducting layer can be formed as a ground layer.

The diameter of the hole portion may be within the range of 0.05 mm to 0.5 mm. With the above, the connector region is capable of providing sufficient electrical connection, and the density of the connection between the object to be connected in the connector region can be increased. Accordingly, as a result, the mounting efficiency of the substrate can be increased. Furthermore, connection with the semiconductor element and the flat cable will be possible.

The liquid metal may include Ga and Sn and, in particular, may include Ga, In, and Sn. With the above, when electrical connection is established in the connector region, the liquid metal in a liquid state can be used.

Another substrate may be provided on a first conductor layer side of the substrate. With the above, a thinner connector region can be used also in a multilayer substrate that forms a complex circuit.

A fourth conductor layer may be included on a side of the first conductor layer opposite to the recess. For example, when soldering the circuit board, the fourth conductor layer can be one in which wettability of the solder has been sufficiently considered, and a sufficient electric connection can be achieved on the side of the first conductor layer opposite to the recess.

Furthermore, another aspect of the present invention that achieves the object described above provides a circuit device that includes a circuit board according to either of the present disclosure described above, and a circuit wiring portion that includes a conductive and projecting contact portion that comes in contact with the liquid metal. With the above, a circuit device that establishes electrical connection, that is thinner, and that has a higher maintainability can be obtained.

The circuit wiring portion may be held to the circuit board with a spring member or an adhesive tape. With the above, a stable electric connection can be established while having a simple holding structure.

The projecting contact portion may have a conic shape that is tapered towards the circuit board. According to the above, it will be easy to insert the projecting contact portion into the liquid metal, and even in a case in which the surface of the liquid metal is an oxide film with higher electric resistance, for example, the oxide film can be broken and the projecting contact portion can be made to be in conductive contact with the liquid metal in a reliable manner.

The present disclosure is capable of providing a circuit board that is capable of establishing electrical connection, that is smaller, and that has a higher maintainability. Furthermore, the present disclosure is capable of providing a circuit device that establishes electrical connection, that is smaller and thinner, and that has a higher maintainability. Accordingly, a connector structure that has a new conductive connection configuration, that is superior in maintainability, that is low in height, and that is capable of facilitating increase in density can be obtained.

DESCRIPTION OF THE PREFERRED EMBODIMENTS

Figure 1:
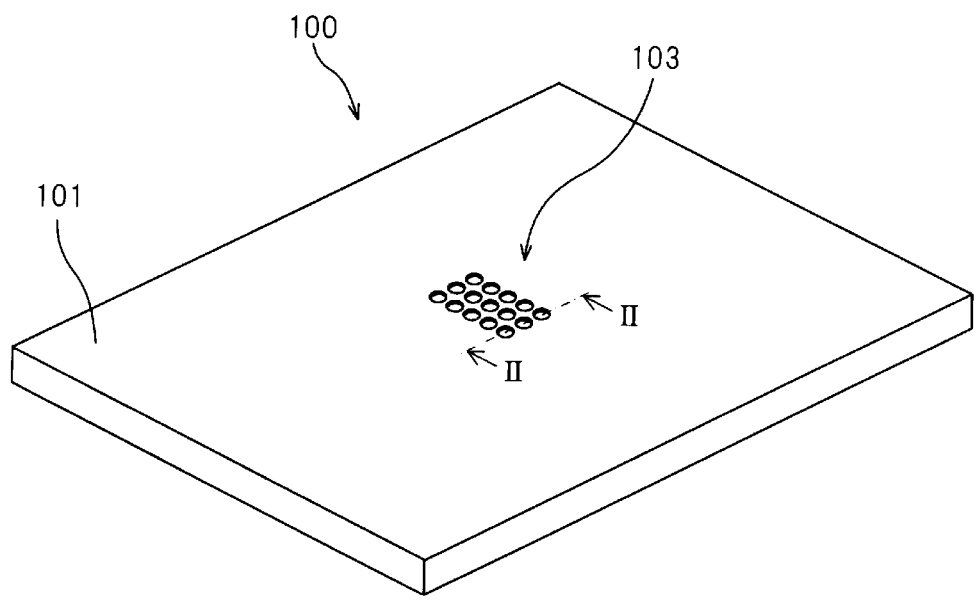
FIG. 1 is an explanatory drawing illustrating a circuit board according to an exemplary embodiment.

Hereinafter, embodiments of the present invention will be described with reference to the drawings. Components that are common among each of the embodiments will be attached with the same reference numerals and redundant description thereof will be omitted. Furthermore, redundant descriptions of common use methods, effects, and the like will be omitted as well.

Exemplary Embodiment [FIGS. 1 to 6]
Configuration of Circuit Board 100

As illustrated in FIG. 1, a circuit board 100 includes a substrate 101, and a connector region 103 in which liquid metal 210 is disposed. A plurality of liquid metal 210 are disposed so as to be aligned in the connector region 103; however, the number and the disposition of the liquid metal 210 are not limited to the above. A fiber-reinforced resin, such as polyimide, an epoxy resin laminate, flame retardant type 4 (FR-4), or the like, or another material may be used as the material of the substrate 101. Furthermore, the substrate 101 may be a substrate on which an electric circuit is formed by printing a conductor on a front surface and/or a back surface of the substrate 101.

Figure 2:
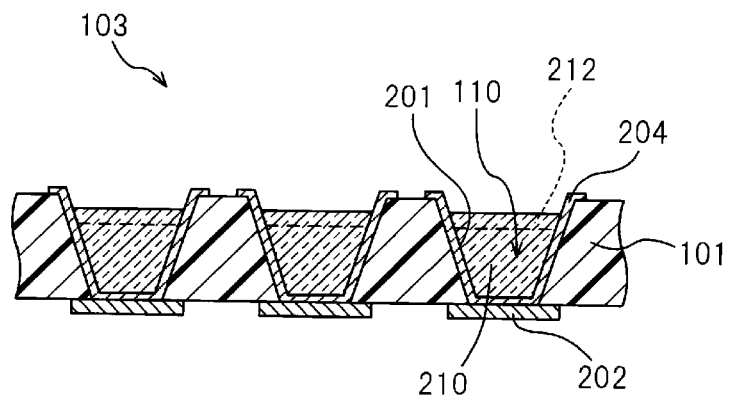
FIG. 2 is a cross-sectional view taken along line II-II in FIG. 1.

FIG. 2 is a diagram illustrating an example of a cross section taken along line II-II in FIG. 1. The connector region 103 of the substrate 101 includes hole portions 110 that penetrate the substrate 101 in a plate thickness direction, and one side of each hole portion 110 is closed by a first conductor layer 202. The diameter of each hole portion 110 may be within the range of 0.05 mm to 0.5 mm. The first conductor layer 202 may be formed of metal. Metal such as copper (Cu), aluminum (Al), gold (Au), platinum (Pt), nickel (Ni), or the like, a lamination of various types of metal, or an alloy may be used. The liquid metal 210 is filled and disposed in recesses 201 that are formed by the hole portions 110 and the first conductor layer 202. A material including gallium (Ga) and tin (Sn), for example, may be used in the liquid metal 210. More desirably, Galinstan (trademark) that is a eutectic alloy of gallium (Ga), indium (In), and tin (Sn) is used. The term liquid metal 210 may be defined as metal that has a melting point lower than the material used in the substrate 101, for example, and may be metal that is liquid in the range of 5 to 35° C. or, further, may be metal that is liquid in the range of 15 to 25° C. The boiling point of Galinstan described above is 1300° C. or higher and the melting point is about −19° C. Galinstan is a material that falls within the scope of both of the above temperature ranges.

A second conductor layer 204 that is in contact with the liquid metal 210 and that is formed in the recesses 201 is formed in the connector region 103. Metal that can prevent the first conductor layer 202 from diffusing into the liquid metal 210 may be used in the second conductor layer 204. For example, in a case in which Galinstan is used in the liquid metal 210, if the second conductor layer 204 is a Cu layer, then the second conductor layer 204 diffuses into the Galinstan; accordingly, the second conductor layer 204 can be a Ni layer that does not have the above deficiency. Furthermore, the thickness of the second conductor layer 204 may be within the range of 0.3 μm to 5 μm and as such, diffusing of the first conductor layer 202 can be suppressed while maintaining high conductivity.

Figure 3:
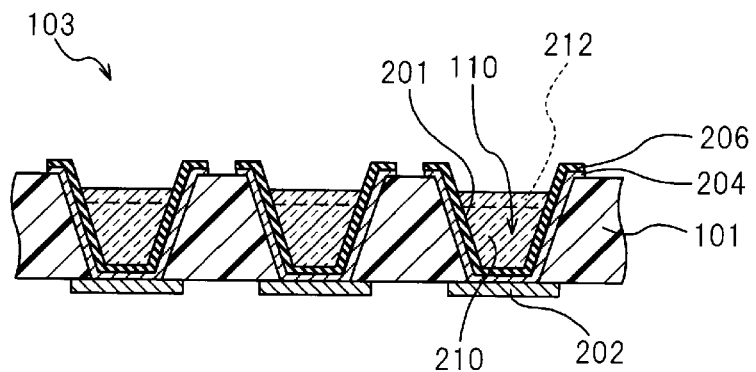
FIG. 3 is a cross-sectional view of another exemplary embodiment having an additional third conductor layer between the second conductor layer in FIG. 2 and the liquid metal.

Furthermore, as illustrated in FIG. 3, a third conductor layer 206 may be further formed between the second conductor layer 204 and the liquid metal 210. The third conductor layer 206 may have a role of preventing formation of an oxide film on the surface of the second conductor layer 204. For example, the third conductor layer 206 may be an Au layer. Furthermore, the thickness of the third conductor layer 206 may be within the range of 0.001 μm to 0.5 μm. In such a case, the third conductor layer 206 is capable of efficiently preventing formation of an oxide film on the surface of the second conductor layer 204 and is capable of filling the pinholes formed in the second conductor layer 204 as well. The third conductor layer 206 may be a layer that diffuses into the liquid metal 210 by being in contact with the liquid metal 210.

As illustrated in FIGS. 2 and 3, the liquid metal 210 includes an oxide film 212 serving as a "sealing layer" near the surface in contact with air. Vaporization and leaking of the liquid metal 210 can be suppressed with the oxide film 212. For example, if the liquid metal 210 is vaporized by generation of heat from electrification, or if the liquid metal 210 leaks due to tilting of the circuit board 100, contact areas between projecting contact portions 805 described later (see FIG. 4) and the liquid metal 210 decrease, which may affect the electric connection. However, since the amount of decrease caused by vaporization and leaking can be minimized by having an oxide film 212 be formed on the liquid metal 210 itself, a stable electric connection can be maintained. The oxide film 212 is formed like thin skin on the liquid surface side of the liquid metal 210. For example, in a case in which Galinstan is used in the liquid metal 210, insertion force needed to break the oxide film 212 with the projecting contact portion 805 is small only amounting to insertion force countering the buoyancy that the oxide film 212 receives from the liquid metal 210. Accordingly, the oxide film 212 can be broken by the projecting contact portion 805 with a low insertion force, and after the oxide film 212 is broken, the projecting contact portion 805 can be inserted inside the liquid metal 210 with a small insertion force and be in conductive contact therewith.

Connecting Circuit Board 100 and Wiring Circuit Unit 800 to Each Other

Figure 4:
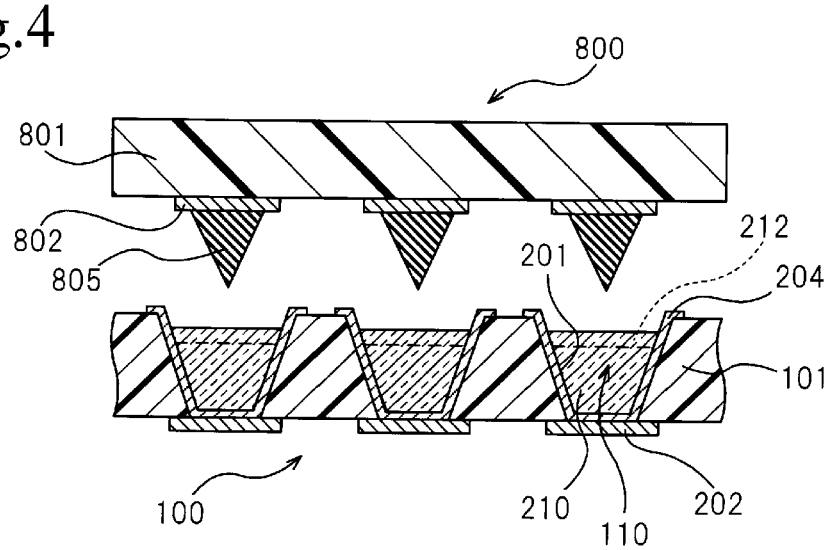
FIG. 4 is a cross-sectional view corresponding to FIG. 2 and is a cross-sectional view illustrating an electric connection between the circuit board in FIG. 1 and a wiring circuit unit.
Figure 5:
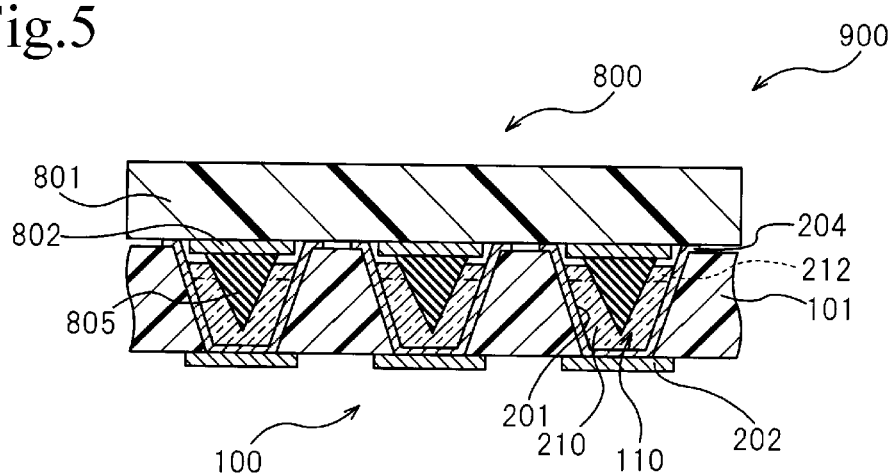
FIG. 5 is a cross-sectional view continuous from FIG. 4 and is a cross-sectional view illustrating the electric connection between the circuit board and the wiring circuit unit.

FIGS. 4 and 5 are cross-sectional views corresponding to FIG. 2, and are cross-sectional views for describing an electrical connection between the circuit board 100 and a wiring circuit unit 800 with the liquid metal 210 interposed therebetween. As illustrated in FIG. 4, the wiring circuit unit 800 includes, for example, a base material portion 801 including a substrate and a resin film or the like, and connection terminals 802 that are connected to wiring and a circuit that are formed on the base material portion 801. Furthermore, the wiring circuit unit 800 further includes the projecting contact portions 805 that connect the connection terminals 802 and the liquid metal 210 to each other.

The projecting contact portions 805 are made to break the oxide films 212 and enter the recesses 201 to have such a wiring circuit unit 800 to be in conductive communication with the connector region 103 of the circuit board 100 as illustrated in FIG. 5. With the above, circumferences of the projecting contact portions 805 come in contact with the liquid metal 210, and the circuit board 100 and the wiring circuit unit 800 become conductively connected to each other and form a circuit device 900. As described above, by having the projecting contact portions 805, which are solids, and the liquid metal 210, which is a liquid when coming into contact, come in contact with each other, different from a case in which solids having the same contact area come in contact with each other, contact can be established without any gap; accordingly, the contact area can be increased and the resistance during energization can be smaller.

Desirably, each projecting contact portion 805 has a conic shape that is tapered towards the distal end, such as a cone shape or a pyramid shape. Such a conic shape can be formed by having metal in contact with the connection terminal 802 be torn away leaving a portion thereof, for example. The conic shape enables the oxide films 212 each with a high electric resistance to be reliably broken and have the projecting contact portions 805 come in contact with the unoxidized area of the liquid metal 210. For example, Au or Ni plated copper or another metal may be used in the projecting contact portions 805.

As described above, in the circuit board 100 according to the present exemplary embodiment, the liquid metal 210 inside the substrate 101 is used in establishing the electrical connection in the connector region 103; accordingly, the circuit device 900 can be made thin. Furthermore, since the electric connection is achieved with the liquid metal 210, dismounting is facilitated and ease of maintenance can be increased. Heat treatment through a brazing process, such as soldering, is not needed and the manufacturing process can be simplified. Furthermore, since the recesses 201 can be arranged with high density, the mount area can be smaller. Furthermore, since the wiring circuit unit 800 can be connected without using any connectors, such as a screw or a spring, area saving can be achieved and the mount density of the substrate 101 can be improved.

Manufacturing Process of Circuit Board 100

Figure 6:
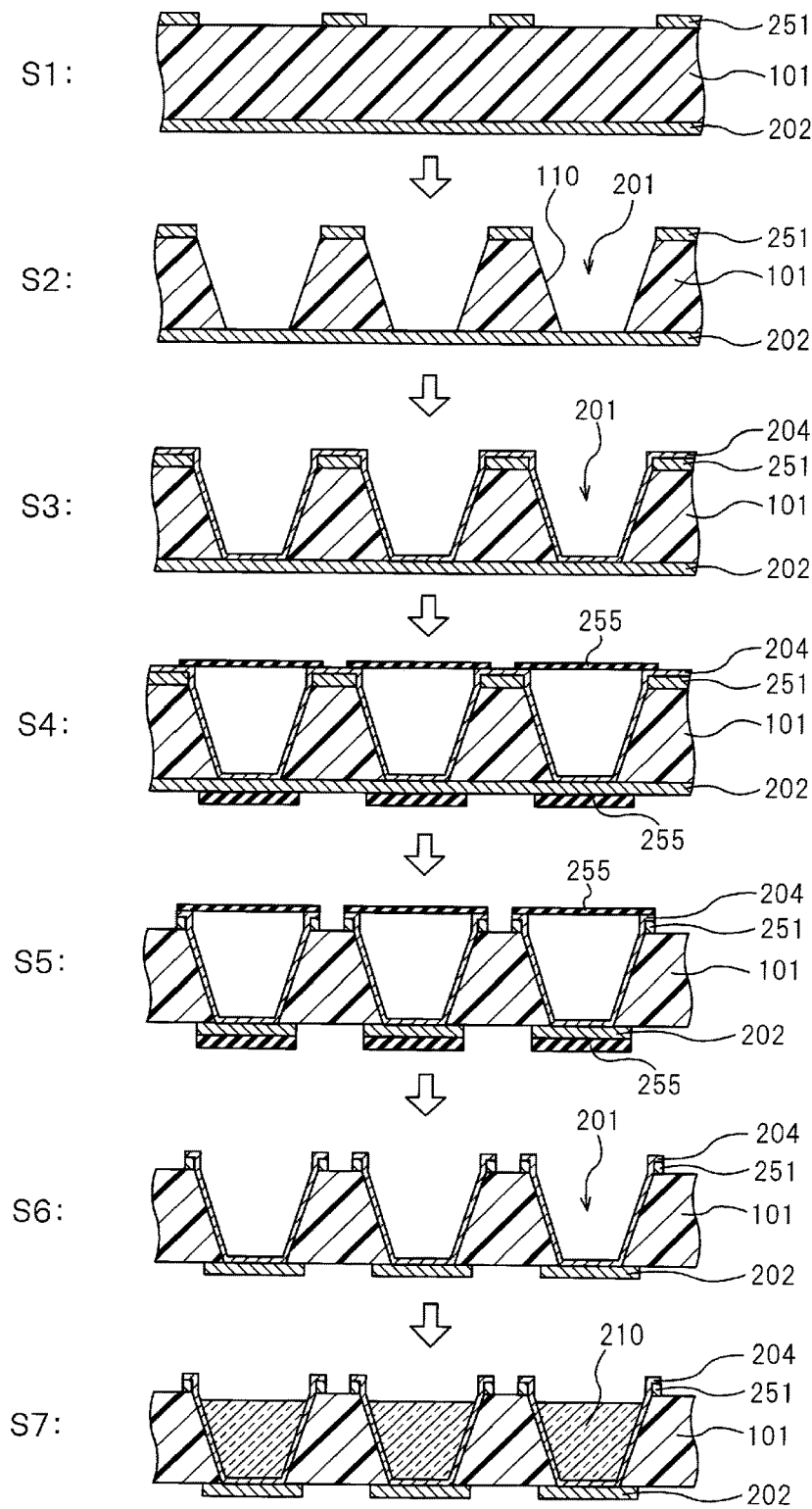
FIG. 6 illustrates explanatory drawings of a manufacturing process of a circuit board according to an exemplary embodiment.

FIG. 6 is a flowchart of a manufacturing process of the circuit board 100 according to an exemplary embodiment. First, in step S1, the substrate 101 on which a mask conductor layer 251 is formed on the front surface and on which the first conductor layer 202 is formed on the back surface is prepared. In the above, the first conductor layer 202 is formed on the entire back surface of the substrate 101, and the mask conductor layer 251 is formed in portions other than the portions where the hole portions 110, in which the liquid metal 210 is filled, are formed. The first conductor layer 202 and the mask conductor layer 251 may be formed of a Cu layer formed by a foil, by printing, or by plating. Subsequently, in step S2, the hole portions 110 are formed in the substrate 101 by etching. In the above, since one side of each of the hole portions 110 is closed by the first conductor layer 202, each of the recesses 201 is formed at the same time. In step S3, the second conductor layer 204 is deposited. The second conductor layer 204 can be formed of a Ni layer, for example.

Subsequently, in step S4, a mask 255 is formed to perform etching on the first conductor layer 202, the second conductor layer 204, and the mask conductor layer 251. Specifically, in order to disconnect the electrical connections of adjacent recesses 201 in both the front surface side and the back surface side, the mask 255 is formed on the front surface side with, for example, a resist film to cover the recesses 201, and on the back surface side as well, the mask 255 is formed in portions corresponding to the recesses 201. Successively, in step S5, etching is performed, and the first conductor layer 202 and the second conductor layer 204 are disconnected from those of the adjacent recesses 201 with the etching. In step S6, a treatment to remove the masks 255 is performed, and in step S7, when the liquid metal 210, for example, Galinstan, is filled into the recesses 201, the sealing layers is formed on the liquid surface side with the oxide film 212. With the above, the circuit board 100 is obtained. In the circuit board 100 according to the manufacturing process in FIG. 6, although the mask conductor layer 251 remains in some portions, the mask conductor layer 251 does not have to be left. Furthermore, the manufacturing process of the circuit board 100 is not limited to the manufacturing process described above.

Modifications and Examples of Exemplary Embodiment [FIGS. 7 to 14]

Figure 7:
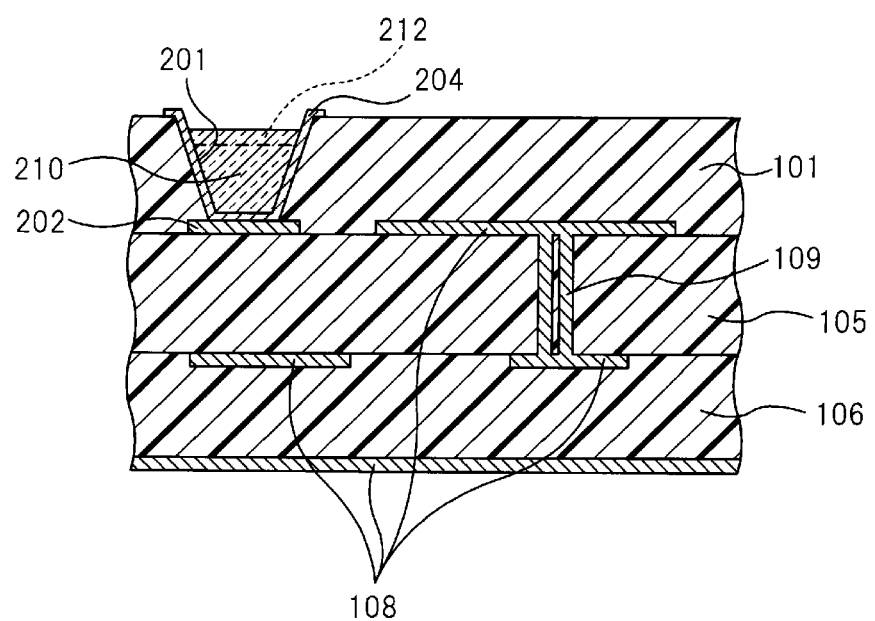
FIG. 7 is a cross-sectional view of a circuit board according to an exemplary embodiment including a wiring substrate.

Exemplary Embodiment of Circuit Board 100 in which Wiring Substrates are Layered FIG. 7 is a diagram illustrating an example in which a wiring substrate 105 and a wiring substrate 106 are further layered on the back surface side of the substrate 101. As illustrated in the diagram, the wiring substrate 105 and the wiring substrate 106 include wiring 108 forming a circuit together with the first conductor layer 202 of the substrate 101. Furthermore, for example, a via 109 penetrating the wiring substrate 105 may be provided. As described above, the circuit board 100 may be a circuit board 100 in which one or more layers of wiring substrates 105 and 106 are layered in addition to the substrate 101. With the above, a thinner connector region 103 can be used also in a multilayer substrate that forms a complex circuit.

Figure 8:
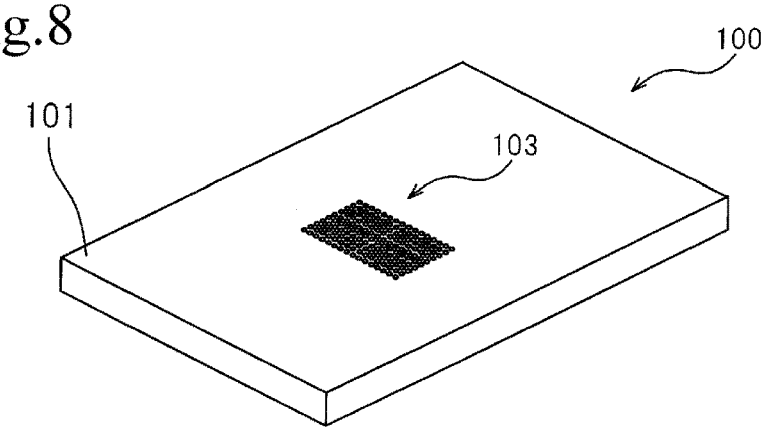
FIG. 8 is an external perspective view of an exemplary embodiment including a connector region of the liquid metal.
Figure 9:
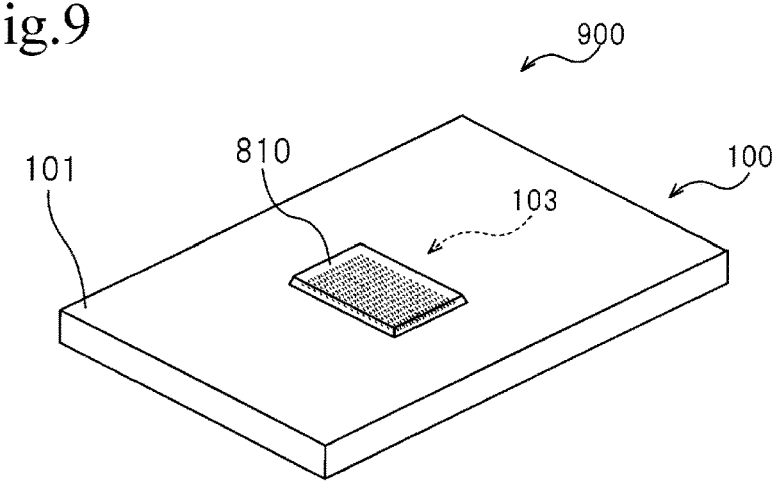
FIG. 9 is an external perspective view illustrating a state in which a semiconductor element is connected to the connector region in FIG. 8.
Figure 10:
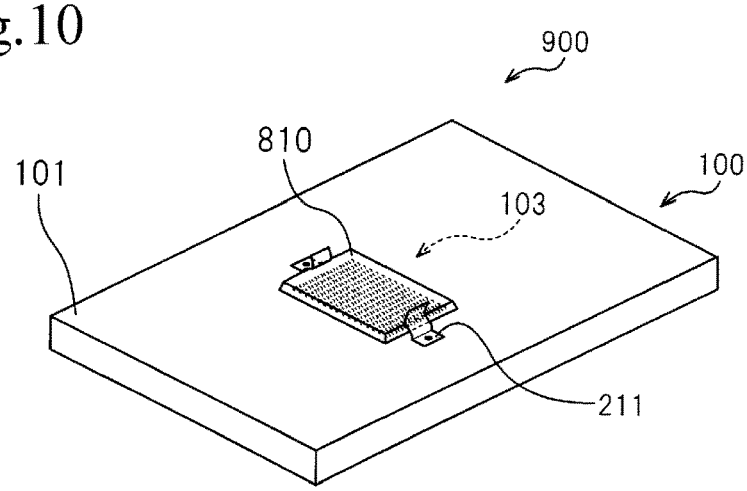
FIG. 10 is an external perspective view illustrating a state in which the semiconductor element in FIG. 9 is fixed with spring members.

Exemplary Embodiment of Circuit Board 100 on which Semiconductor Element 810 is Mounted FIGS. 8 and 9 are diagrams illustrating the circuit board 100 on which a semiconductor element 810 is mounted in the connector region 103 in which the liquid metal 210 is disposed. As illustrated in FIG. 8, the circuit board 100 includes, corresponding to the disposition of the connection terminals of the semiconductor element 810 that is an example of the wiring circuit unit 800, the connector region 103 in which the liquid metal 210 is disposed. As illustrated in FIG. 9, by mounting the semiconductor element 810 in the connector region 103, the circuit device 900 in which the circuit formed on the circuit board 100, and the circuit formed on the semiconductor element 810 are electrically connected to each other is formed. FIG. 10 is a diagram illustrating an example of a case in which the semiconductor element 810 is fixed with spring members 211. Each spring member 211 includes a fixing end in which one end side thereof is fixed to the substrate 101, and a bent lock portion that is locked to the upper edge of the semiconductor element 810 is formed from the fixing end. Furthermore, an introducing portion that extends obliquely upwards and outwards with respect to the upper edge of the semiconductor element 810 is formed from each bent lock portion. The introducing portions allow the mounted semiconductor element 810 to be mounted smoothly with the guides of the introducing portions. As illustrated in the diagram, for example, by pressing down the upper edges of the semiconductor element 810 with mountainous-shape bent lock portions of a pair of spring members 211 fixed to the substrate 101, the semiconductor element 810 can be fixed to the substrate 101 in a further firm manner. In the above, the spring members 211 can dispose and dismount the semiconductor element 810 in a direction perpendicular to the surface of the circuit board 100. Furthermore, rather than with the spring members 211, the semiconductor element 810 can be fixed with an adhesive tape.

Exemplary Embodiment of Circuit Board 100 to which Flat Cable 820 is Connected

Figure 11:
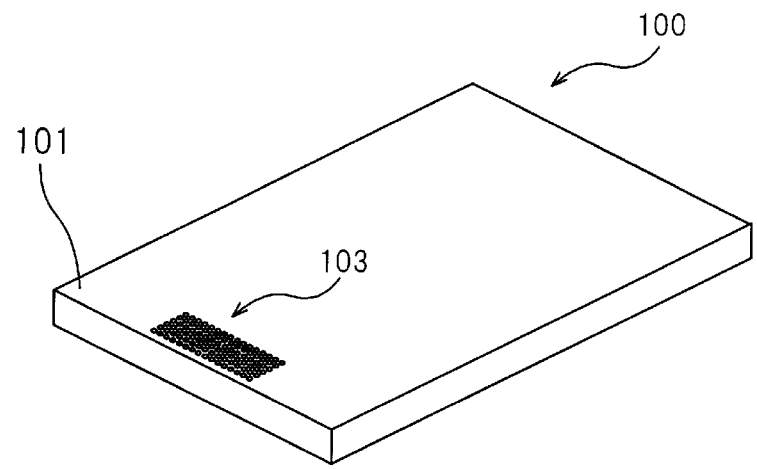
FIG. 11 is an external perspective view of another exemplary embodiment including a connector region of the liquid metal.
Figure 12:
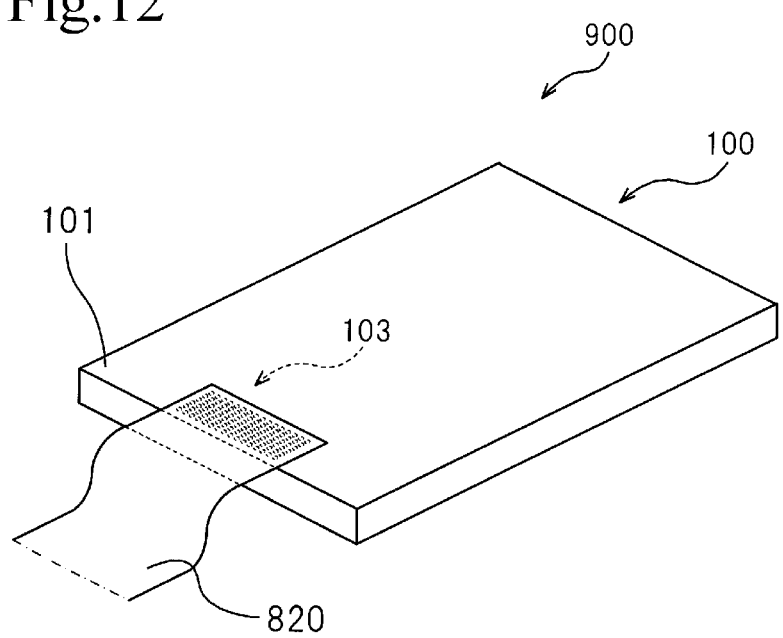
FIG. 12 is an external perspective view illustrating a state in which a flat cable is connected to the connector region in FIG. 11.

FIGS. 11 and 12 are diagrams illustrating the circuit board 100 to which a flat cable 820 is conductively connected in the connector region 103 in which the liquid metal 210 is disposed. As illustrated in FIG. 11, the circuit board 100 includes, corresponding to the disposition of the connection terminals 802 of the flat cable 820 that is an example of the wiring circuit unit 800, the connector region 103 in which the liquid metal 210 is disposed. As illustrated in FIG. 12, by attaching the flat cable 820 to the connector region 103, the circuit device 900 in which the circuit formed on the circuit board 100, and the wiring formed in the flat cable 820 are electrically connected to each other is formed. In FIGS. 8 to 12, a case in which the wiring circuit unit 800 is constituted by the semiconductor element 810 and the flat cable 820 is illustrated; however, the wiring circuit unit 800 is not limited to the above and another wiring circuit, such as a flexible printed circuit (FPC), can be used.

Exemplary Embodiment of Circuit Board 100 Mounted on Wiring Substrate 300

Figure 13:
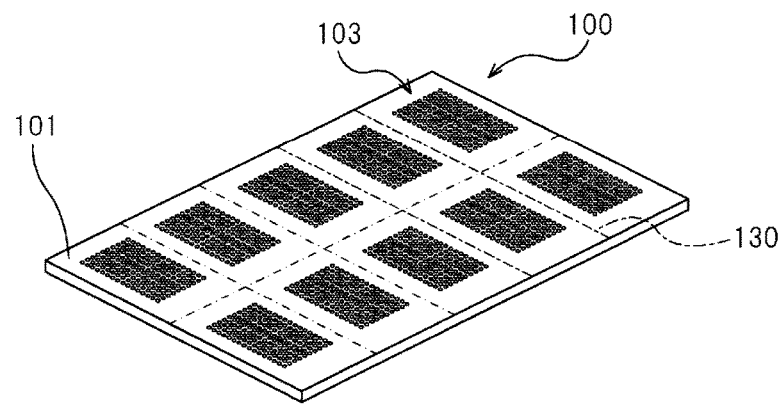
FIG. 13 is an explanatory drawing illustrating an exemplary embodiment in which a plurality of connector region is formed in a single substrate.
Figure 14:
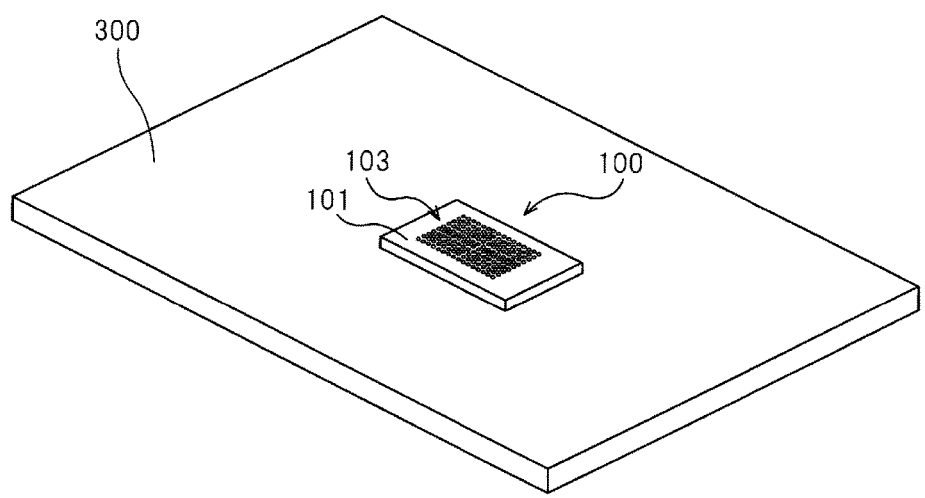
FIG. 14 is an explanatory drawing illustrating an exemplary embodiment in which a circuit board is used as a socket mounting a wiring circuit unit.

FIG. 13 is a diagram illustrating an example in which a plurality of connector regions 103 are formed on a single substrate 101. In the above example, ten connector regions 103 are formed on a single substrate 101. By dividing the substrate 101 along cutting plane lines 130, ten circuit boards 101 can be manufactured. As illustrated in FIG. 14, the circuit boards 100 manufactured in the above manner can be, for example, mounted on a wiring substrate 300 while having an electrical connection. In such a case, in mounting the wiring circuit unit 800, the circuit board 100 is disposed between the wiring substrate 300 and the wiring circuit unit 800. As described above, the circuit board 100 can be used as a socket to mount the wiring circuit unit 800.

Figure 15:
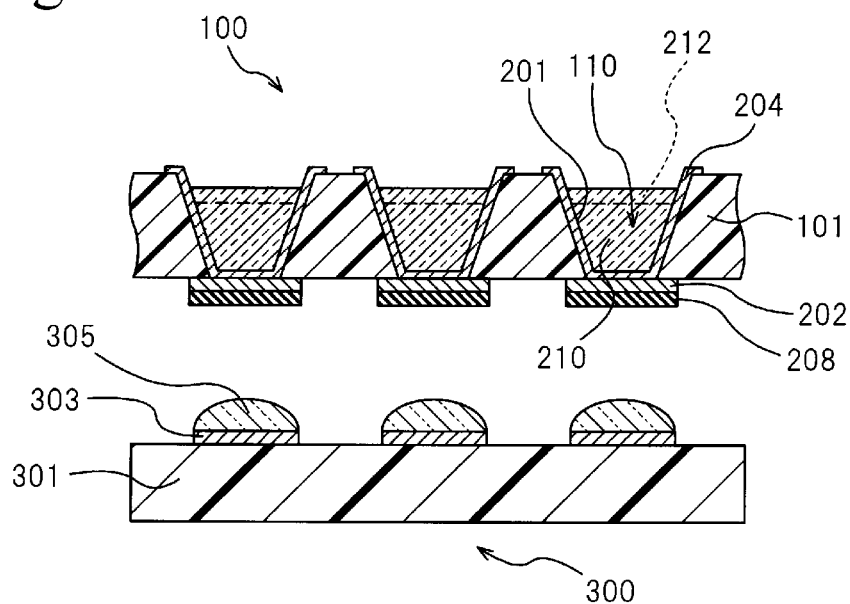
FIG. 15 is an explanatory drawing illustrating a circuit board including a fourth conductor layer on a side opposite to a recess side of the first conductor layer, and a wiring substrate that is connected to the circuit board.
Figure 16:
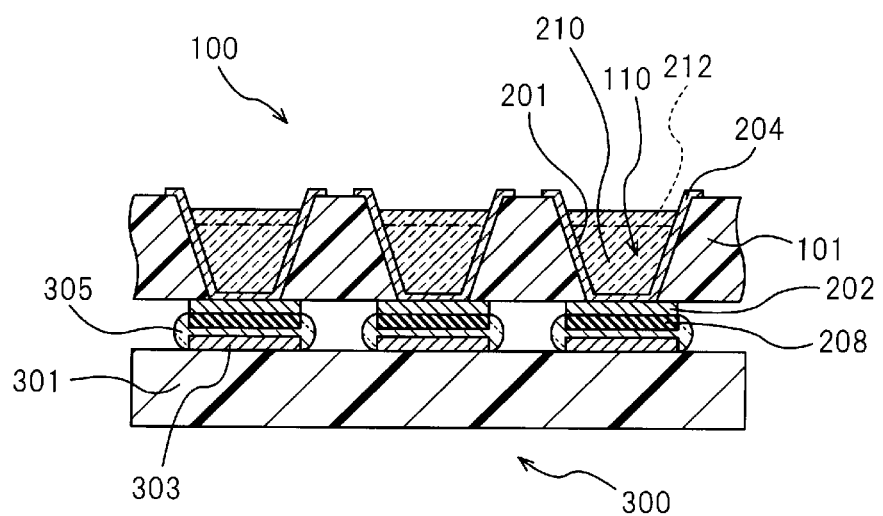
FIG. 16 is an explanatory drawing illustrating a state in which the circuit board including the fourth conductor layer on the side opposite to the recess side of the first conductor layer, and the wiring substrate are connected to each other.

Not limited to the case illustrated in FIG. 13 in which a plurality of circuit boards 100 are formed in a single substrate 101, the circuit board 100 can be mounted on a wiring substrate, such as the wiring substrate 300. FIGS. 15 and 16 illustrate the circuit board 100 that includes a fourth conductor layer 208 on the side of the first conductor layer 202 opposite to the recess 201 side, for example. A material that has high wettability with solder can be used in the fourth conductor layer 208, for example. By so doing, as illustrated in FIG. 16, terminals 303 formed on the wiring substrate 300 can be electrically connected to the fourth conductor layer 208 with solder 305 interposed therebetween. Note that Au or the like can be used in the fourth conductor layer 208. Not limited to the example above, the fourth conductor layer 208 may be formed so as to be suitable for electric connection, such as a BGA or the like.

04 formed in the recess 201.

What is claimed is:

1. A circuit board comprising:
    a substrate including a hole portion that penetrates the substrate in a thickness direction; and
    a connector region including
        a first conductor layer that closes one side of the hole portion,
        liquid metal disposed in a recess formed by closing one side of the hole portion by the first conductor layer, and
        a sealing layer that coats a surface of the liquid metal,
    wherein the sealing layer is penetrated by an object to be connected so that the liquid metal in the connector region comes in contact with the object,
    wherein the sealing layer is a film obtained by oxidizing the liquid metal at the liquid metal surface in contact with air.

2. The circuit board according to claim 1, further comprising:
    a second conductor layer in the recess, the liquid metal being in contact with the second conductor layer.

3. The circuit board according to claim 2,
    wherein the second conductor layer is formed of a nickel (Ni) layer.

4. The circuit board according to claim 1, further comprising:
    a second conductor layer provided along the recess, and
    a third conductor layer provided on the second conductor layer and in contact with the liquid metal in the hole portion.

5. The circuit board according to claim 4,
    wherein the third conductor layer is formed of a gold (Au) layer.

6. The circuit board according to claim 1,
    wherein the liquid metal includes gallium (Ga) and tin (Sn).

7. The circuit board according to claim 1, wherein the liquid metal includes Ga, indium (In), and Sn.

8. The circuit board according to claim 1, further comprising:
    another substrate on a first conductor layer side of the substrate.

9. The circuit board according to claim 1, further comprising:
    a fourth conductor layer on a side of the first conductor layer opposite to the recess.

10. A circuit device comprising:
    the circuit board according to claim 1; and
    a circuit wiring portion including a conductive and projecting contact portion in contact with the liquid metal.

11. The circuit device according to claim 10, further comprising:
    a spring member that holds the circuit wiring portion to the circuit board.

12. The circuit device according to claim 10, further comprising:
    an adhesive tape that holds the circuit wiring portion to the circuit board.

13. The circuit device according to claim 10,
    wherein the conductive and projecting contact portion has a conic shape that is tapered towards the circuit board.

14. The circuit device according to claim 10,
    wherein the conductive and projecting contact portion penetrates the sealing layer and comes in contact with the liquid metal.

\* \* \* \* \*